United States Patent
Liikanen (10) Patent No.: US 10,698,636 B1
(45) Date of Patent: Jun. 30, 2020

(54) TRIGGER MARGIN BASED DYNAMIC PROGRAM STEP CHARACTERISTIC ADJUSTMENT

(71) Applicant: Micron Technology, Inc., Boise, ID (US)

(72) Inventor: Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 16/214,419

(22) Filed: Dec. 10, 2018

(51) Int. Cl.
| | |
|---|---|
| G06F 12/00 | (2006.01) |
| G06F 3/06 | (2006.01) |
| G11C 16/10 | (2006.01) |
| G06F 11/07 | (2006.01) |
| G11C 16/04 | (2006.01) |

(52) U.S. Cl.
CPC .......... *G06F 3/0659* (2013.01); *G06F 3/0619* (2013.01); *G06F 3/0679* (2013.01); *G06F 11/073* (2013.01); *G06F 11/076* (2013.01); *G06F 11/0793* (2013.01); *G11C 16/10* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 8,862,969 B2 | 10/2014 | Liikanen et al. | |
| 10,140,040 B1* | 11/2018 | Koudele | G11C 16/3495 |
| 2016/0110124 A1* | 4/2016 | Camp | G06F 3/0619 |
| | | | 714/704 |
| 2016/0179428 A1* | 6/2016 | Parker | G06F 3/0653 |
| | | | 711/103 |
| 2017/0091006 A1* | 3/2017 | Camp | G06F 3/0619 |
| 2018/0341552 A1 | 11/2018 | Liikanen et al. | |
| 2019/0007160 A1* | 1/2019 | Shih | H04L 1/203 |
| 2019/0056994 A1* | 2/2019 | Shulkin | G06F 11/1048 |
| 2019/0278643 A1* | 9/2019 | Camp | G06F 11/076 |
| 2019/0347013 A1* | 11/2019 | Pletka | G06F 3/0619 |
| 2019/0355435 A1* | 11/2019 | Liikanen | G11C 16/3495 |
| 2020/0066355 A1* | 2/2020 | Papandreou | G11C 16/3427 |
| 2020/0075118 A1* | 3/2020 | Chew | G11C 29/44 |

OTHER PUBLICATIONS

U.S. Appl. No. 15/981,835, entitled "Memory System Quality Margin Analysis and Configuration", filed May 16, 2018, Client Reference No. 2018-0169.00/US, (40 pgs.).
U.S. Appl. No. 16/182,399, entitles "Memory Element Profiling and Operational Adjustments", filed Nov. 6, 2018, Client Reference No. 2018-0057.00/US, (34 pgs.).
U.S. Appl. No. 16/121,565, entitled "Memory Characterization and Sub-System Modification", filed Sep. 4, 2018, Client Reference No. 2017-1179.00/US, (41 pgs.).

* cited by examiner

Primary Examiner — John A Lane
(74) Attorney, Agent, or Firm — Brooks, Cameron & Huebsch, PLLC

(57) ABSTRACT

Embodiments can include a scan of data associated with programmed memory cells is performed. The scan of data results in a bit error count (BEC) histogram. A trigger margin is determined from the BEC histogram. The determined trigger margin and a target trigger margin are compared. In response to the determined trigger margin being different than the target trigger margin, one or more program step characteristics is adjusted to adjust the determined trigger margin toward the target trigger margin.

20 Claims, 8 Drawing Sheets

TRIGGER MARGIN BASED DYNAMIC PROGRAM STEP CHARACTERISTIC ADJUSTMENT

TECHNICAL FIELD

Embodiments of the disclosure relate generally to memory sub-systems, and more specifically, relate to trigger margin based dynamic program step characteristic adjustment.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to managing trigger margin within a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

For example, various memory components (e.g., dies) can have different associated trigger margins, which can affect system write performance. Various previous approaches may not provide an ability to adequately and/or accurately adjust trigger margin. Conventional memory sub-systems do not dynamically adjust trigger margin and/or are not capable of adjusting the trigger margin in a predictable and/or controllable manner. Therefore, various conventional systems are not able to, for example, maintain a target trigger margin with changing temperature and/or program/erase cycling. Therefore, it can be beneficial to provide the ability to adjust (e.g., tune) the trigger margin in order to reduce trigger margin variance among memory components to improve system performance.

Trigger margin can refer to, for example, a difference between a bit error count and a system trigger condition. Put another way, the trigger margin can refer to a margin between a desirable performance and a point at which a system can fail due to accumulations of errors. The bit error count represents a number of bit errors at a predetermined threshold for initiating a change in programming step. The system trigger condition can include a predetermined condition for initiating an error recovery mechanism, such as a number of error bits or a number of bad or incorrect instances of codewords. Improved performance associated with the programming time can be bounded by the trigger margin, which can be a measure of the rate of system produce ECC recovery. Furthermore, the ability to adjust the trigger margin can provide benefits such as providing the ability to maintain a constant trigger margin throughout a life of a system, to counteract negative affects due to temperature, counteract negative effects from a large number of program/erase cycles (which can decrease the trigger margin), and minimize a large dither response. For example, adjusting the trigger margin can provide increased data reliability or increased quality of service (e.g., speed) by maintaining a particular trigger margin that provides optimal performance without increasing rates of failure.

In various memory sub-systems, programming cells can involve providing a programming signal to a group of cells (e.g., a page) to place them in target states, which correspond to respective stored data patterns. For example, the cells can be non-volatile flash memory cells configured to store one or more bits of data per cell. As an example, a programming signal used to program the cells can comprise a stepped voltage signal (e.g., voltage ramp) with each step having an associated step size (referred to as a program step size) and duration (referred to as program step duration). The programming signal can be applied (e.g., to a word line) as a series of voltage pulses, for instance. The voltage pulses have various characteristics which can affect a trigger margin associated with the programmed cells. Such characteristics include pulse magnitude, step size between pulses, and pulse duration, among various other characteristics.

Aspects of the present disclosure provide the ability to finely control the trigger margin (e.g., to achieve a target trigger margin) based on a determined relationship between one or more program step characteristics including a program step size and a determined trigger margin, and between one or more program step characteristics including a program step duration and a determined trigger margin, which is used to fine tune the determined trigger margin to a target trigger margin. For example, the relationships between the program step size and the trigger margin and the program step duration and the trigger margin can be determined and used to adjust either or both of the program step size and the program step duration to achieve a particular (e.g., constant) trigger margin. As an example, a feedback loop of a previous trigger margin can be used to determine an amount of adjustment to the program step size, the program step duration, or a combination of such, based on the relationship in response to a current trigger margin being different than a target trigger margin.

In this way, a fine control of the trigger margin can improve drive to drive program time variation by having all drives use the same program step size and/or program step duration to achieve a constant trigger margin. This can maintain a consistent target trigger margin over the life of a memory die even in reaction to programming changes that occur due to wear cycling and/or due to temperature fluctuations.

Figure 1:
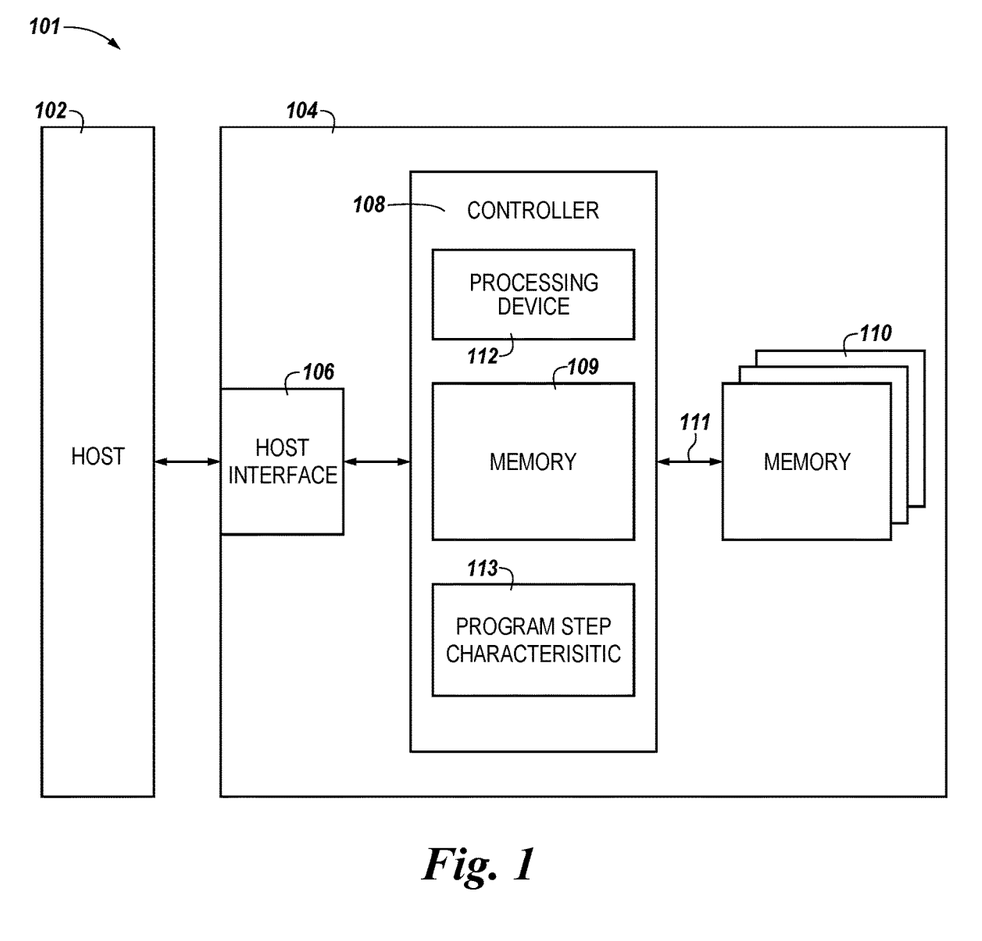
FIG. 1 illustrates an example computing environment that includes a memory sub-system in accordance with some embodiments of the present disclosure.

FIG. 1 illustrates an example computing environment 101 that includes a memory sub-system 104 in accordance with some embodiments of the present disclosure. As used herein, a memory sub-system 104, a processing resource (e.g., a controller) 108, or memory components 110 might also be separately considered an "apparatus." The memory sub-system 104 can be a solid state drive (SSD), for instance, and can include a host interface 106, a processing resource 108 (e.g., a controller and/or other control circuitry), and a memory 110, which can include a number of memory components (e.g., NAND flash components) providing a storage volume for the memory sub-system 104. The memory sub-system 104 can be a single memory device.

As illustrated in FIG. 1, the processing resource 108 can be coupled to the host interface 106 and to the memory components 110 via a memory interface 111 and can be used to send data between the memory sub-system 104 and a host 102. The memory interface 111 can be one of various interface types compliant with a particular standard such as Open NAND Flash interface (ONFi).

Host 102 can be a host system such as a personal laptop computer, a desktop computer, a digital camera, a mobile telephone, or a memory card reader, among various other types of hosts. Host 102 can include a system motherboard and/or backplane and can include a number of processors. Host 102 can also be a processing resource, such as where memory sub-system 104 is a memory device having an on-die controller (e.g., 108).

The host system 102 can be coupled to the memory sub-system 104 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102.

The processing resource 108 can communicate with the memory components 110 (which in some embodiments can be a number of memory arrays on a single die) to control data read, write, and erase operations, among other operations. In some embodiments, the processing resource 108 can be on the same die or a different die than the memory components 110.

Although not specifically illustrated, in some embodiments, the processing resource 108 can include a discrete memory channel controller for each channel coupling the processing resource 108 to a number of memory components, including memory components 110. The processing resource 108 can include, for example, a number of components in the form of hardware and/or firmware (e.g., one or more integrated circuits) and/or software for controlling access to the number of memory components and/or for facilitating data transfer between the host 102 and memory components 110.

As illustrated in FIG. 1, the processing resource 108 can include a memory (e.g., local memory) 109 and a processing device 112. For example, the memory 109 can include latches and circuitry. The memory 109 can have discrete components such as an application specific integrated circuit (ASIC) or the components may reflect functionally provided by circuitry within the processing resource 108 that does not necessarily have a discrete physical form separate from other portions of the processing resource 108. Although illustrated as components within the processing resource 108 in FIG. 1, the memory 109 can be external to the processing resource 108 or have a number of components located within the processing resource 108 and a number of components located external to the processing resource 108.

The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include any combination of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

The processing resource 108 (which may be referred to as "controller" 108) can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field programmable gate array (FPGA), an application specific integrated circuit (ASIC), etc.), or other suitable processor. The controller 108 can include a processing resource (e.g., processing device 112) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code. While the example memory sub-system 104 in FIG. 1 has been illustrated as including the controller 108, in another embodiment of the present disclosure, a memory sub-system 104 may not include a controller 108, and may instead rely upon external control (e.g., provided by an external host, such as by a processing device separate from the memory sub-system 104).

The controller 108 can use and/or store various operating parameters associated with programming the memory cells. Such operating parameters can include programming pulse magnitude, step size, pulse duration, program verify voltages, etc. for various different programming processes. The different programming processes can include processes to program cells to store different quantities of bits, and different multiple pass programming process types (e.g., 2-pass, 3-pass, etc.). In general, the controller 108 can receive commands or operations from the host system 102 and can convert the commands or operations into instructions or appropriate commands to achieve the desired access to the memory components 110. The controller 108 can be responsible for other operations such as wear leveling operations, garbage collection operations, error detection and error-correcting code (ECC) operations, encryption operations, caching operations, and address translations between a logical block address and a physical block address that are associated with the memory components 110. The controller 108 can further include host interface circuitry to communicate with the host system 102 via the physical host interface. The host interface circuitry can convert the commands received from the host system into command instructions to access the memory components 110 as well as convert responses associated with the memory components 110 into information for the host system 102.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry (can receive an address from the controller 108 and decode the address to access the memory components 110.

In various embodiments, the controller 108 can include a program step characteristic component 113 that can determine and/or control one or more program step characteristics used to program cells. The characteristics can be, for example, a size of a stepped voltage signal (e.g., a program step size). In another example, the characteristic can be a duration of a stepped voltage signal (e.g., a program step duration).

The memory components 110 can include memory cells for the write or program operation, such as for incremental step pulse programming (ISPP). The memory cells can be programmed (via controller) via an ISPP process in which a series of pulses of increasing magnitude are applied to the cells (to their gates) to increase the stored charge by a particular amount until the target stored charge (Vt) is reached.

Figure 2:
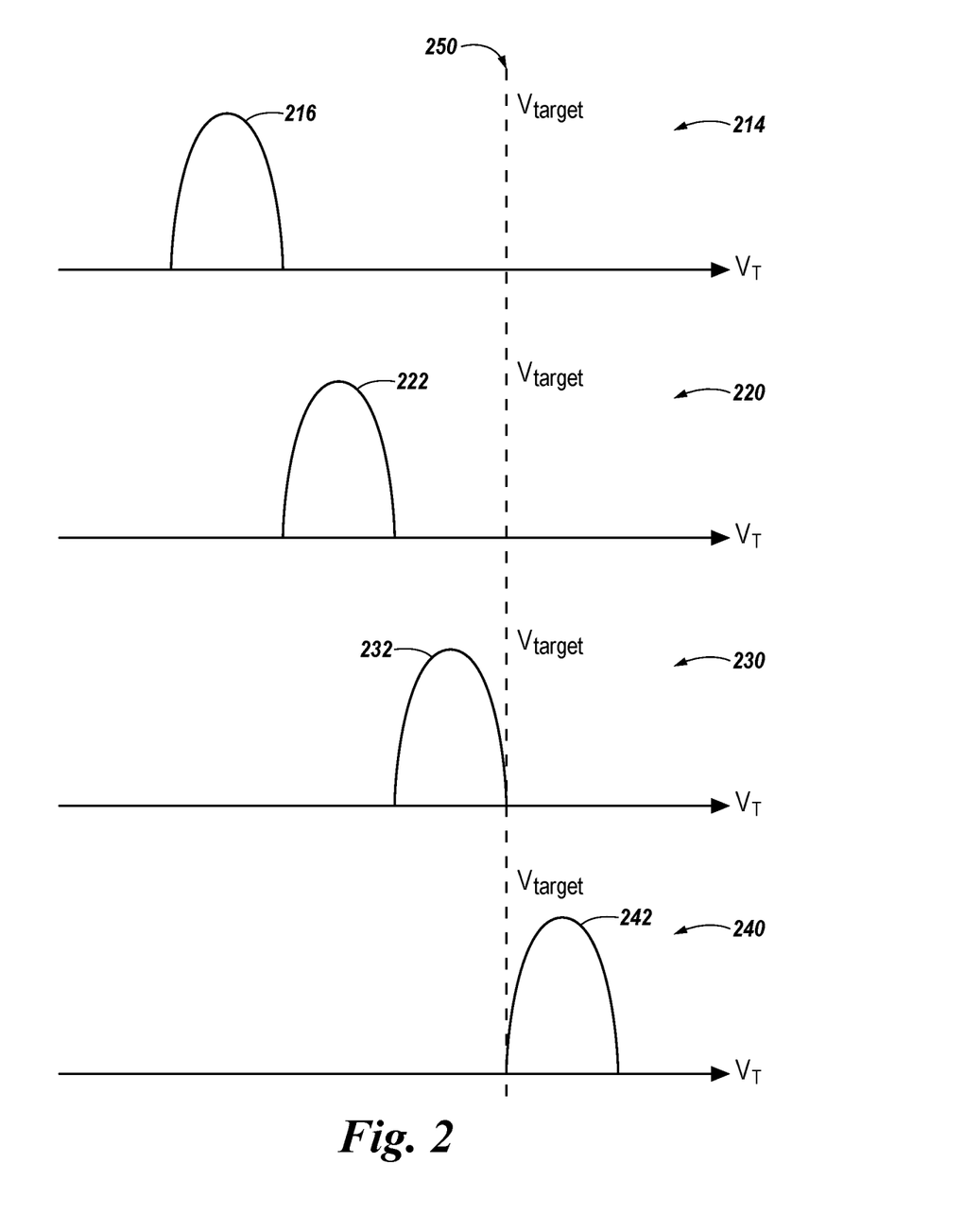
FIG. 2 illustrates an example of programming memory cells in accordance with some embodiments of the present disclosure.

For example, FIG. 2 illustrates threshold voltage (Vt) distributions of cells, which correspond to the charge stored on the charge storage structures of the memory cells, at various stages of one such incremental programming operation. Time 214 can represent a time at which the programming operation begins. Accordingly, as shown by Vt distribution 216, at time 214 the Vt of all the cells is below the target Vt level (Vtarget) 250. To program the memory cells to the desired target Vtarget 250, a series of programming steps (e.g., voltage pulses) can be used at each of a number of subsequent times 220, 230 and 240 to increase the cell Vt levels as shown by distributions 222, 232 and 242, respectively. After each programming step, a program verify operation can be performed to verify whether the cells being programmed have reached Vtarget 250. As shown in FIG. 2, programming of the cells is completed at time 240, as the Vt levels of all the cells have been increased to at or above the desired target Vt level 250, the programming operation is completed.

The amount by which the Vt distributions 216, 222, 232, and 242 increase responsive to an applied programming pulse can depend on various factors such as the magnitude of the pulse (e.g., program step size) and the duration for which the pulse is applied to the cells (e.g., program step duration). Accordingly, the time to program a group of cells to desired states can vary depending upon the programming signal characteristics as well as the quantity of pulses. Additionally, as described further below, multiple programming passes can be used to program multiple logical page data to cells. For example a first pass, which may be referred to as a lower page programming process, can be used to program one or more lower pages of data to a group of cells, and one or more subsequent programming passes can be used to program additional pages of data to the group of cells.

Figure 3:
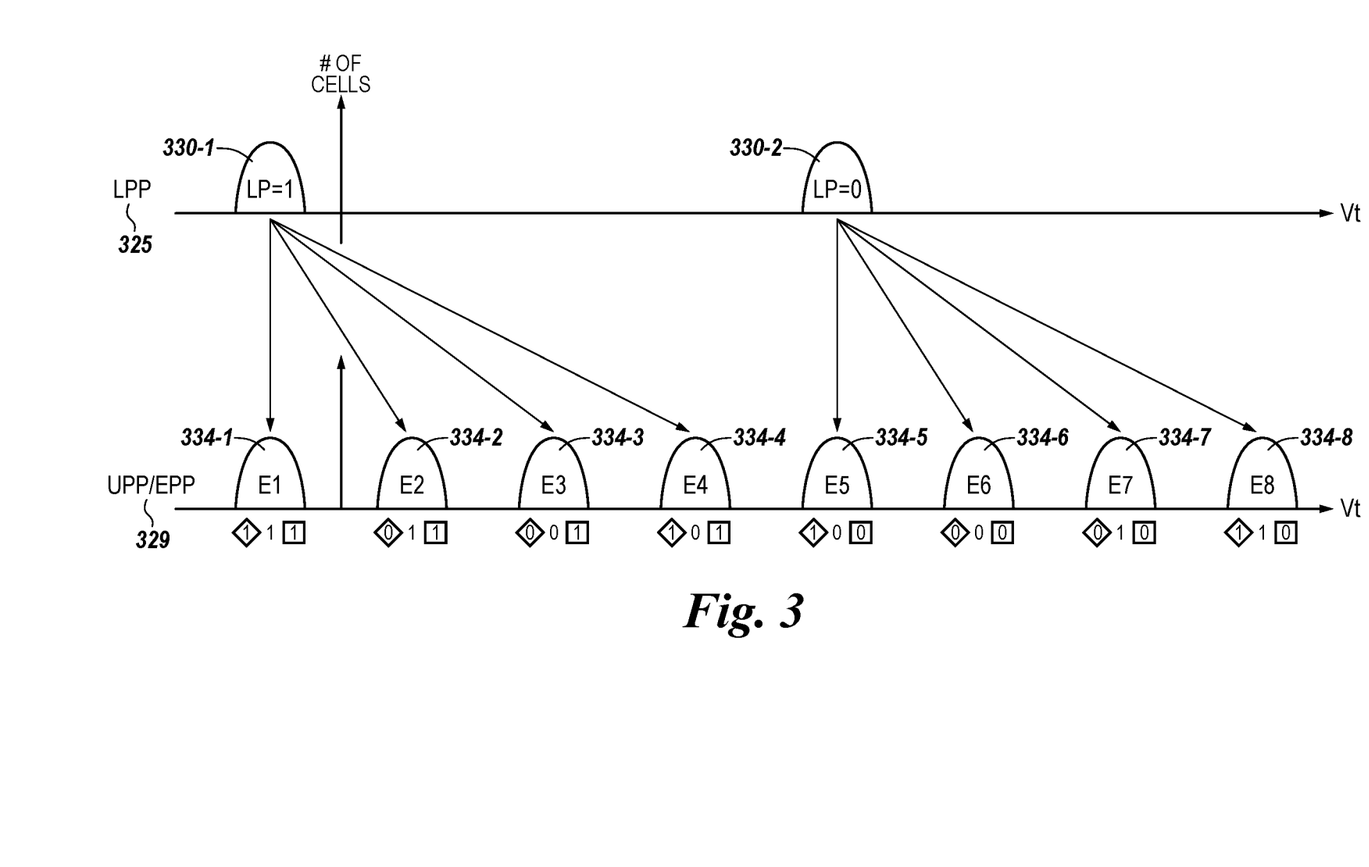
FIG. 3 illustrates an example of programming memory cells in accordance with some embodiments of the present disclosure.

The diagram shown in FIG. 3 illustrates threshold voltage (Vt) distributions associated with a programming process that can be performed in accordance with embodiments of the present disclosure. In this example, the process is a two-pass programming process in which a lower page (e.g., lease significant bit) of a group of memory cells is programmed in a first programming pass and an upper page (e.g., middle bit) and extra page (e.g., most significant bit) of the group are programmed in a second programming pass. The first programming pass can be referred to as a lower page programming (LPP) process 325, and the second programming pass can be referred to as an upper page programming and extra page programming process (UPP/EPP) 329.

As described further below, each of the LPP process 325 and UPP/EPP process 329 can involve application of a series of programming pulses to a selected word line corresponding to the group of cells being programmed. As part of the LPP process 325, the Vt of the memory cells are adjusted (e.g., from an erased Vt level) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325. A lower page is a lower order page and is programmed in the array of memory cells before higher order pages are programmed.

As part of the UPP/EPP process 329, the Vt of the memory cells are adjusted to one of eight levels represented by Vt distributions 334-1 to 334-8, which correspond to data states E1 to E8, respectively, with each one of the data states E1 to E8 representing a different 3-bit stored data pattern. In this example, cells programmed to data state E1 store data "111," cells programmed to data state E2 store data "011," cells programmed to data state E3 store data "001," cells programmed to data state E4 store data "101," cells programmed to data state E5 store data "100," cells programmed to data state E6 store data "000," cells programmed to data state E7 store data "010," and cells programmed to data state E8 store data "110." While the example illustration includes a 2-pass programming, this is but one example. Additional quantities of program passes can be used. An example calculation for the illustrated 2-pass programming can include a ((Pass 1+Pass 2)/3) determination (as is further described in association with FIG. 5 below). As the two passes are used for programming three separate bits, this calculation can determine an average duration (e.g., time) per page (corresponding to a bit) to perform the programming. However, additional passes, additional bits, etc. can be used for the programming and determination of program duration.

Figure 4A:
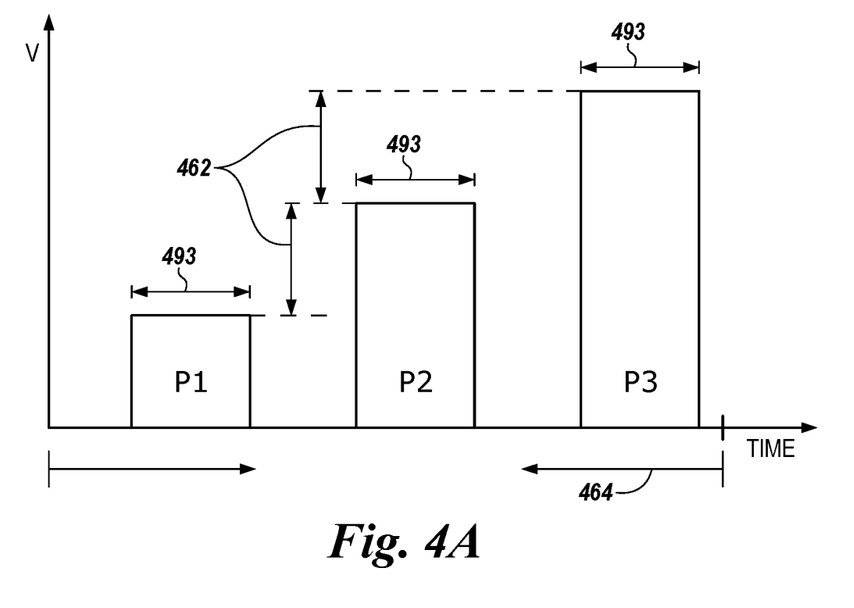
FIG. 4A-B each illustrate an example of programming steps for programming memory cells in accordance with embodiments of the present disclosure.
Figure 4B:
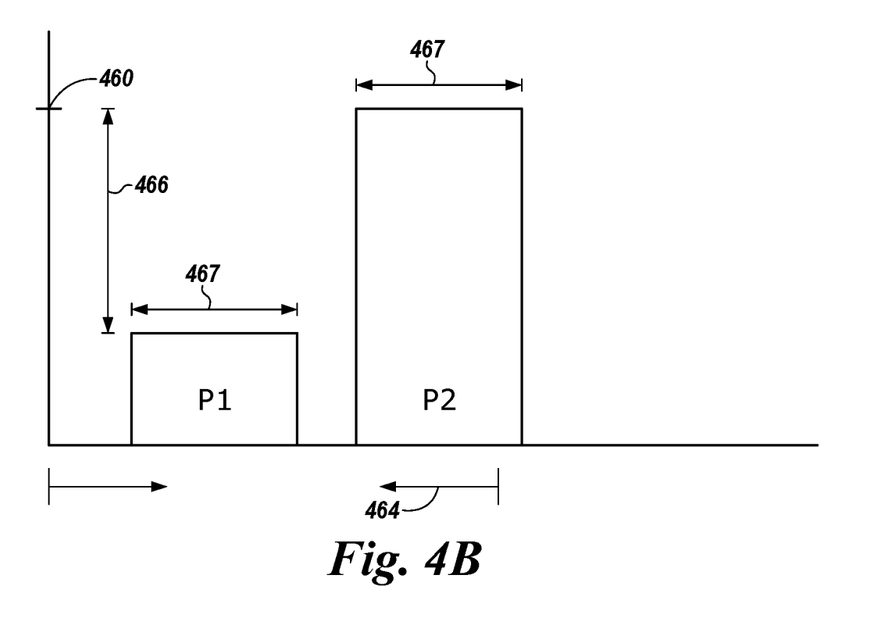

FIG. 4A-B each illustrate example programming signals in accordance with embodiments of the present disclosure. The example illustrations represent programming pulses applied to memory cells (e.g., to their gates) to increase the cell threshold voltages (Vts) to target levels. FIG. 4A illustrates a number of pulses P1, P2, and P3 associated with a programming operation having a particular PET 464. As shown in FIG. 4A, each pulse has a pulse duration 493, which may be referred to as a program step duration, and a program step size 462 between consecutive pulses.

The PET 464 can be associated with a series of pulses (e.g., P1, P2, P3) applied to a group of cells to place the cells of the group in respective target states. For example, the PET 464 can correspond to the amount of time to program each of a group of cells to one of the states E1 to E8 shown in FIG. 3. The memory system can dynamically increase or decrease the programming step size 462 and/or step duration 493, which will correspondingly increase or decrease the programming effective time 464 and correspondingly increase or decrease the trigger margin by a particular amount based on determined relationships. In at least one example, this dynamic increase or decrease can be performed by the program step characteristic component 113 to dynamically adjust or calibrate the programming step size 462 and/or duration 493.

FIG. 4B illustrates the programming operation after implementing a programming step adjustment. For comparison, the previous program step size and program step durations, such as 462 and 493, respectively, in FIG. 4A, are illustrated. The adjusted program step size 466 is a calibrated or changed instance of the program step size 462 for replacing the program step size 462. The adjusted program step size 466 is illustrated as being greater than the program step size 462, however, adjustments can be an increase or a decrease in the program step size. Likewise, the adjusted program step duration 467 is a calibrated or changed instance of the program step duration 493 for replacing the program step duration 493. The adjusted program step duration 467 is illustrated as being greater than the program step duration 493, however, adjustments can be an increase or a decrease in the program step duration depending on a desired change in the trigger margin, as is illustrated in association with FIGS. 5-6. As described further below, a relationship may exist between the adjustment of a program step size and the adjustment of the program step duration. That is, the adjustment of the program step size can be in a particular proportion to the adjustment of the program step duration based on a relationship between the program step size and the program step duration, resulting in a target trigger margin.

Dynamically adjusting the program step size 462 to increase to the program step size 466 and adjusting the program step duration 493 to increase to the program step duration 467, as illustrated in FIG. 4B can increase the error rate, which provides the benefit of a decreased trigger margin. A decreased trigger margin thereby increases performance while maintaining an acceptable trigger margin to avoid a failure. As illustrated in this example, the increase in the program step size and program step duration can reduce the number of pulses used to reach the programming level voltage of P2 in FIG. 4B. Thus, the dynamic adjustment of the program effective time by adjusting one or more program step characteristics (e.g., one or more of a program step size and a program step duration) can improve the overall efficiency for the memory system while maintaining an acceptable trigger margin.

Moreover, the adjustment of one or more program step characteristics can be generated based on a feedback measure, or a processing result thereof, by adjusting based on a threshold trigger margin to stay above or below. As an example, as a trigger margin goes above a threshold trigger margin, a program step size and/or a program step duration can be adjusted to decrease the trigger margin. Vice versa, as a trigger margin goes below a threshold trigger margin, a program step size and/or a program step duration can be adjusted to increase the trigger margin. Accordingly, trigger margin is fine tuned in order to gain optimal performance while minimizing the risk of a system failure due to an accumulation of errors.

Figure 5:
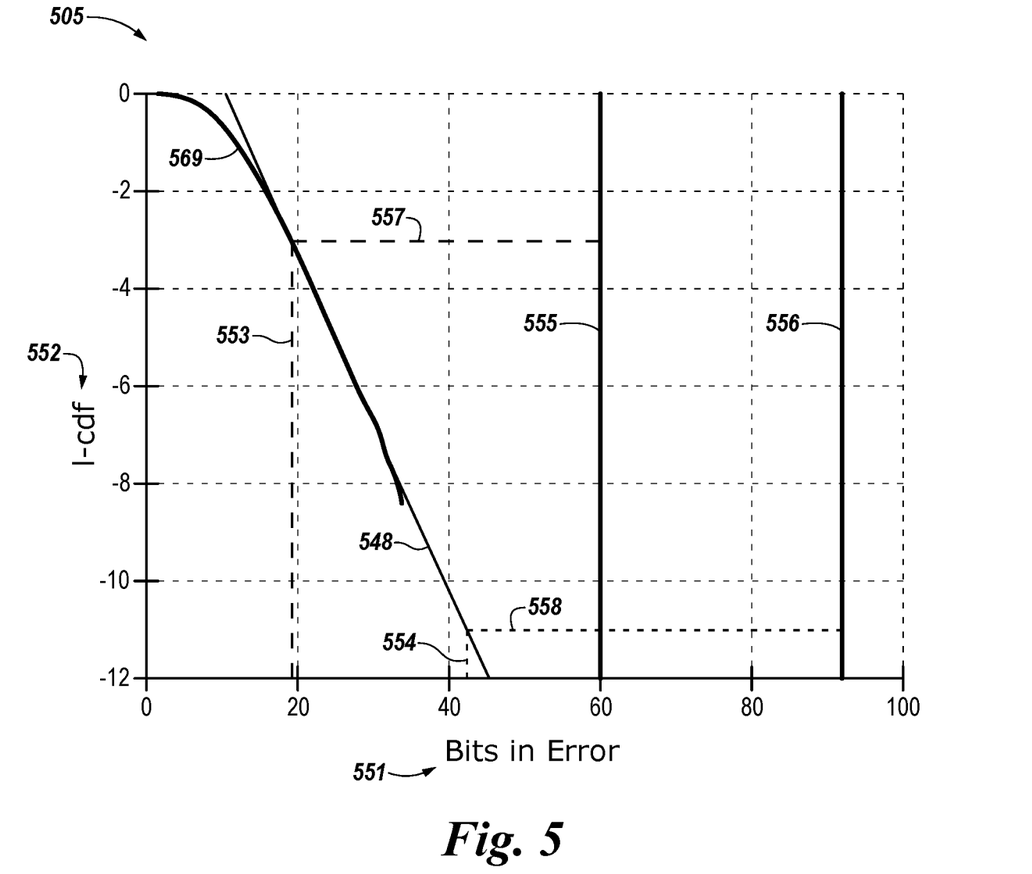
FIG. 5 is a diagram of an example graph indicating relationships associated with trigger margin adjustment.

FIG. 5 is a diagram of an example graph 505 indicating relationships associated with trigger margin adjustment. The example graph 505 includes a logarithmic plot 569 of bits in error 551 (along x-axis) corresponding to a number of codewords, which is represented by an inverse cumulative distribution function (1-cdf) 552, where the cumulative distribution function (cdf) is subtracted from 1 (1-cdf, along y-axis). The 1-cdf 552 is based on background records that track bit errors. The background records include information describing history for the memory sub-system 104. In addition, the background records can track processing results, such as bit errors after error recovery. The background records can be tracked using the controller 108, the host device 102, or a combination thereof. The background records can be stored in the memory 110, the memory 106 of the controller 108, or another memory location of the memory sub-system, the host device 102, or a combination thereof.

The background records can indicate how many bit errors there are in each code word read in a page of data. The number of bit errors can be used to generate a histogram. As an example, in the event of a codeword of ten (10) bit errors, a bin of the histogram can be incremented for ten (10) bits in error. From the histogram, a calculation can be performed on the histogram resulting in the cumulative distribution function (cdf). The cumulative distribution function is a cumulative summation of the number of bits in error for a plurality of codewords. The cumulative summation of the number of bits in error can indicate how many codewords include a particular number of bits in error. That is, the cumulative distribution function performed on the histogram can indicate a cumulative summation of all bins. A bin, used to sum the bits in error, can be associated with each number of bits in error 551 along the x-axis and the bin can include a number of codewords that include that number of bits in error 551. For example, a first bin can be associated with one bit in error and the number of codewords with one bit in error can be in the first bin. A second bin can be associated with two bits in error and the number of codewords with two bits in error can be in the second bin. The first bin can be a vector and can be added to the second bin, also a vector, and so forth along any number of bins (e.g., 100 bins as there are 100 bits in error illustrated in graph 505). The vectors summed from each of the bins can result in the logarithmic plot 569 of data. A logarithmic slope 548 can be used to represent the logarithmic plot 569 to determine additional values, as will be described below. Each of the bins can be divided by the total number of codewords. As an example, cumulatively add one bin onto bin 0, bin 1 to the sum of bin 0, . . . , bin N to the sum of the prior bin. The last value indicating the summation of all bins can be divided through the number of bins, resulting in the cumulative distribution function (cdf) from bins 0 to N. The logarithmic plot of the cdf can take the resulting cdf from bins 0 to N and subtract from 1 (e.g., 1-cdf 552). The last bin will include the total number of codewords used and this divided by the total number of codewords will normalize that bin to 1, therefore all the bins from 0 to N will span from 0 to 1 and result in the cumulative distribution function. As an example, the point on the logarithmic slope 548 that is at −10 on the x-axis (1-cdf 552) indicates that 1 in $10^{10}$ codewords (since the cdf is subtracted from 1, it is inverted) has approximately 40 bits in error, indicated along the y-axis (bits in error) 551.

The 1-cdf plot 552 projects trigger rates at which an error event may occur. Trigger rates refer to how often the system has to go into error recovery and is related to the trigger condition 555 and bits in error 551. The example graph 505 includes a trigger condition 555, which is illustrated as at 60 bits in error. The trigger condition 555 refers to herein a condition where bit errors affect the memory system performance. The trigger condition 555 refers to a threshold where a memory (e.g., a solid state drive (SSD)) invokes various methods in attempts to recover data not readily corrected by a controller's ECC engine. As an example, the decoder of the memory has a particular correction ability to correct a particular number of bits in error using hard data and without accessing soft data. The difference between measured data 548 and the trigger condition 555 is referred to as a trigger margin 557 (which in this example can be a trigger margin of 9.5 dB). The trigger margin 557 is associated with a particular trigger bit error count value 553 (illustrated along the bits in error 551 of the x-axis) of approximately 19. The trigger bit error count value 553 indicates that 1 in $10^3$ codewords has approximately 19 bits in error. The illustrated trigger margin 557 is a ratio and is defined in terms of dB due to the trigger margin 557 being illustrated logarithmically. Adjusting one or more program step characteristics can result in the trigger margin 557 being adjusted by either increasing the trigger margin 557 or decreasing the trigger margin 557 to be equal to a target trigger margin, as is described herein.

In addition to the trigger margin 557, the example graph 505 illustrates an uncorrectable error correction condition (UECC) bit error count 554, a UECC condition value 556, and a UECC margin 558. The UECC margin 558 is the difference between the UECC condition 556 and the UECC bit error count 554 (illustrated as a value of approximately 44). The UECC bit error count 554 refers to a probability that a codeword includes a particular number of errors. As an example, at the point of the UECC margin 558 used in this example, 1 in $10^{11}$ codewords include approximately 44 bits in error. The UECC margin 558 indicates what margin in bit errors there is between current operating bits in error values and how many more bits in errors would lead to a UECC condition, indicating as UECC condition value 556. A UECC condition 556 refers to a condition that is uncorrectable even with the use of soft data. As referred to above, the trigger condition 555 indicates a threshold of bits in error that hard data can be used to correct while the UECC condition refers to a threshold of bits in error that can be corrected using soft data. In order to go beyond the hard data, a memory system can perform side sampling where additional samples of the data have offsets and can provide soft bits or soft data. The decoder can perform correction of more bits in error with this soft data up to the UECC margin 556. Data with bits in error above the UECC condition 556 and the controller may be unable to read and/or correct the data.

Figure 6:
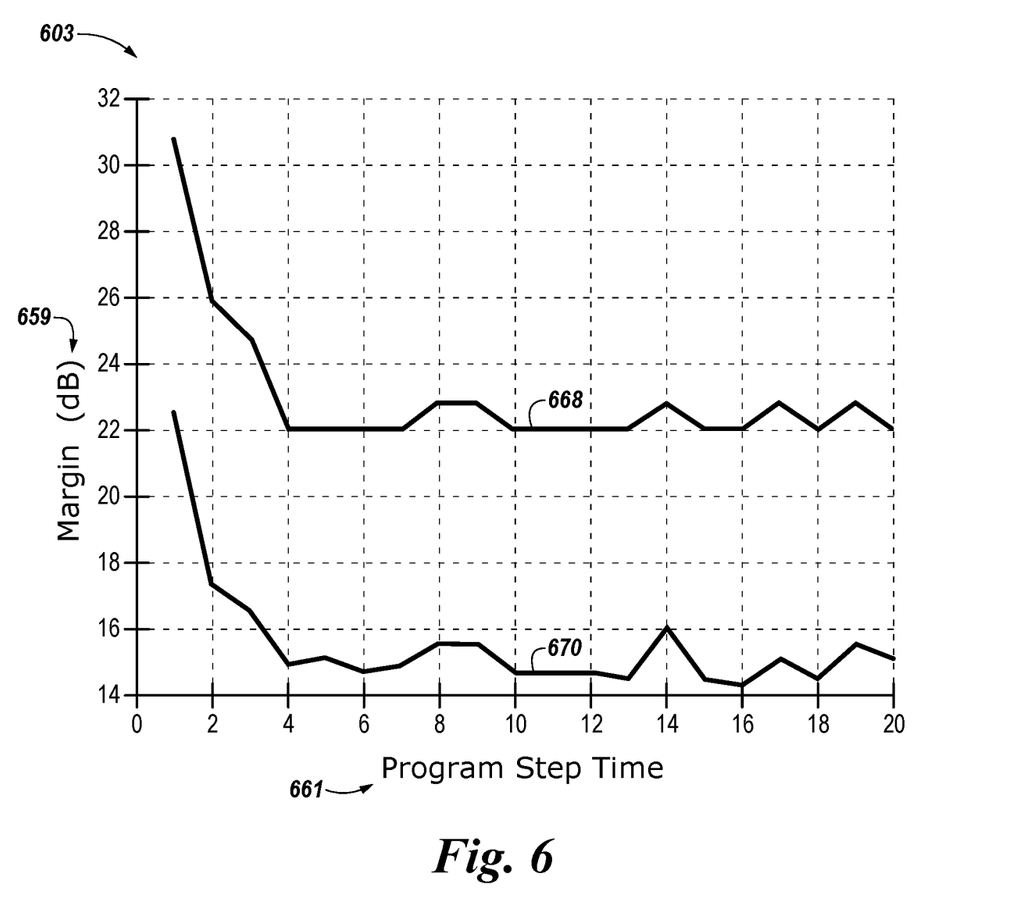
FIG. 6 is a diagram of an example graph indicating a relationship between program step time and margins associated with trigger margin adjustment.

FIG. 6 is a diagram of an example graph 603 indicating a relationship between program step time and margins associated with trigger margin adjustment. The example graph 603 includes values (illustrated along y-axis as Margin (dB) 659) corresponding to a trigger margin 668 and UECC margin 670, each associated with program step time updates 661. As an example, during a first program step time update, the corresponding trigger margin value 668 is illustrated as approximately 31 dB and the corresponding UECC margin value 670 is illustrated as approximately 22. In response to a second program step time update, the corresponding trigger margin value 668 is illustrated as approximately 26 dB and the corresponding UECC margin value 670 is illustrated as approximately 17.5 dB. In this way, each program step update (e.g., adjusting one or more program step characteristics, as described above) adjusts the corresponding trigger margin value 668 and corresponding UECC margin value 670 to adjust these values to a target trigger margin and a target UECC margin.

As is illustrated in FIG. 6, the target trigger margin value that the trigger margin values 668 are adjusted towards is 22 dB and the target UECC margin value that the UECC margin values 670 are adjusted towards is 15 dB. As the trigger margin value 668 moves to a value of 23 dB subsequent to around the $7^{th}$ and $8^{th}$ program step updates, the $9^{th}$ program step update can adjust the trigger margin value 668 down to 22 dB. Likewise, as the UECC margin value 670 goes above 15 dB (subsequent to the $13^{th}$ program step update), the $14^{th}$ program step update can adjust the UECC margin 670 back down to approximately 15 dB.

Figure 7:
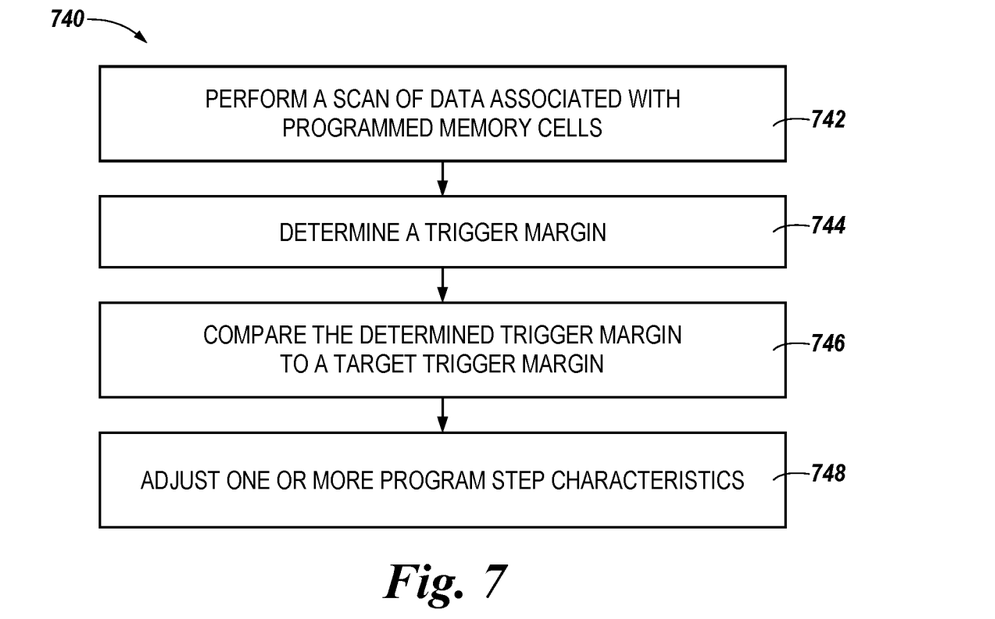
FIG. 7 is a flow diagram of an example method corresponding to adjusting one or more program step characteristics for programming memory cells in accordance with some embodiments of the present disclosure.

FIG. 7 is a flow diagram of an example method 740 corresponding to adjusting one or more program step characteristics (e.g., one or more of a program step size and a program step duration) for programming memory cells in accordance with some embodiments of the present disclosure. The method 740 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 540 is performed by the program step characteristic component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 742, the processing device performs a scan of data associated with programmed memory cells. One or more of the program step characteristics can include a program step size and a program step duration. A relationship can exist between a program step size (e.g., program gate step size) and a trigger margin. A relationship can exist between a program step duration (e.g., a program pulse duration time) and the trigger margin. These relationships can be combined and used to correspond (e.g., in a linear or nonlinear relationship) to the change in trigger margin with a particular resolution (e.g., a higher resolution). In this example, the change in trigger margin ("DeltaTM") can be equal to a change in program step size ("DeltaProgramStep") plus a change in program step duration ("DeltaProgramTime"), as demonstrated by the formula:

DeltaTM=DeltaProgramStep+DeltaProgramTime where a known delta of a program step duration can be equivalent to one increment of a program step size. As an example, if one increment of a program step size results in a 5% change in trigger margin and "n" number of increments of delta program step duration also results in a 5% change in trigger margin, then changing the trigger margin by 5% can be accomplished by either changing the program step size by one increment or changing the program step duration by n number of increments. To change the trigger margin by only 2%, the program step size can remain the same and the program step duration delta could be adjusted by (2%/5%)*n. To change the trigger margin by 13%, the program step size delta could be 2, resulting in 2*5%=10% plus a change in the program step duration of (3%/5%)*n.

In one example, the two relationships can be treated as linear relationships. In one example, the two relationships that affect programming time can be represented by a formula which can include dependencies and non-linear effects. In another example, the relationships can be represented as tables which are indexed in a linear fashion but output differing amounts based on their index. In this example where the delta program step size and the delta program step duration are used as a function, the combination of the two parameters can be computed for a given change in trigger margin. As an example:

[Program Step,ProgramTime]=funcProgramStep_ProgramTime(TriggerMargindelta)

In the example where the delta program step size and the delta program step duration is used as a table lookup, the combination of the two parameters can be pre-computed for a given change in trigger margin, such as in the following table:

TABLE 1

| TableIndex | ProgramStep | ProgramTime | TriggerMargindelta (dB) |
|---|---|---|---|
| 0 | −2 | 0 | −2.00 |
| 2 | −2 | 7 | −1.50 |
| 3 | −1 | 0 | −1.00 |
| 5 | −1 | 10 | −0.50 |
| 6 | 0 | 0 | 0.00 |
| 8 | 0 | 10 | 0.50 |
| 9 | 1 | 0 | 1.00 |
| 11 | 1 | 10 | 1.50 |
| 12 | 2 | 0 | 2.00 |
| 14 | 2 | 12 | 2.50 |

Note that the program step duration for the table index of 2 is 7 and the program step duration for the table index of 14 is 12, illustrating a non-linear relationship.

In relation to program step duration, in at least one example, program step duration can be measured by counting clock cycles of a known frequency between a time a program command was issued to a memory (e.g., a NAND) and when the memory programming operation is complete. In another example, the program step duration can be measured by using a number of program pulses used to complete the memory program operation and apply a known amount of time for each pulse. Trigger Margin can be calculated by using multiple measurements of differing page types or differing programming operations and computing a metric (e.g., a value based on a generated logarithmic scale, as described above) that is used as a feedback for controlling a dynamic TriggerMargin (DTM). As an example:

TM=tPROG((pass1+pass2)/3)

In at least one example, if trigger margin is greater than a user specified margin, then the step time value can be incremented, and vice versa the step time value can be decremented. The computed metric can be based on a scan of data of a memory device results in a generated bit error count (BEC) histogram, as described above.

At block 744, the processing device determines a trigger margin. The trigger margin is calculated from a bit error count (BEC) histogram. The histogram can be used to generate a logarithmic plot of the values of measured bit errors counts, as is described in association with FIG. 5. At block 746, the processing device compares the determined trigger margin to a target trigger margin. The determined trigger margin can be determined to be less than or below the target trigger margin, equal to the target trigger margin, or greater than or above the target trigger margin. At block 748, the processing device can adjust one or more program step characteristics (such as one of the program step time and the program step duration). In response to the determined trigger margin being less than the target trigger margin, the one or more program step characteristics can be adjusted, as described above, to increase the determined trigger margin. In response to the determined trigger margin being equal to the target trigger margin, the one or more program step characteristics can be adjusted by zero or a value close to zero, as described above, to maintain the determined trigger margin at the target trigger margin. In response to the determined trigger margin being greater than the target trigger margin, the one or more program step characteristics can be adjusted, as described above, to decrease the determined trigger margin.

Figure 8:
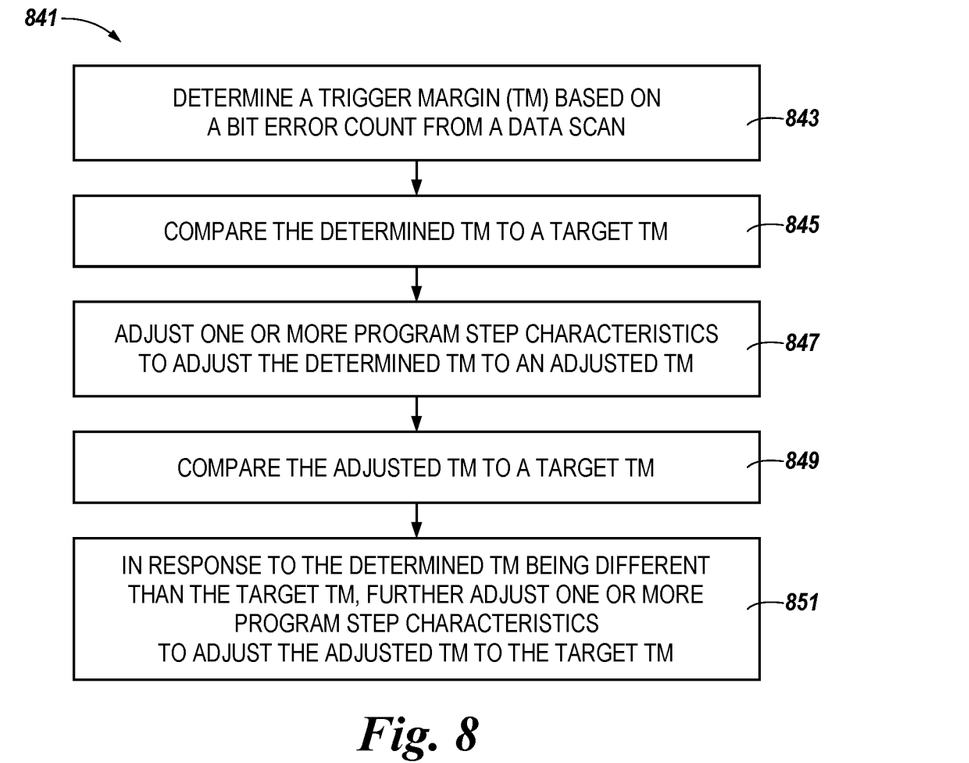
FIG. 8 is a flow diagram of an example method corresponding to adjusting one or more program step characteristics for programming memory cells in accordance with some embodiments of the present disclosure.

FIG. 8 is a flow diagram of an example method 841 corresponding to adjusting one or more program step characteristics (e.g., one or more of a program step size and a program step duration) for programming memory cells in accordance with some embodiments of the present disclosure. The method 841 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 841 is performed by the program step characteristic component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 843, the processing device determines a trigger margin (TM) based on a bit error count from a data scan. The bit error count can be used to generate a histogram. The histogram can be used to generate a logarithmic plot to illustrated bit error counts, as is illustrated in FIG. 5. At block 845, the processing device compares the determined TM to a target TM. The determined trigger margin can be determined to be less than or below the target trigger margin, equal to the target trigger margin, or greater than or above the target trigger margin. At block 847, the processing device adjusts one or more program step characteristics to adjust the determined TM to an adjusted TM. In response to the determined trigger margin being less than the target trigger margin, the one or more program step characteristics can be adjusted, as described above, to increase the determined trigger margin. In response to the determined trigger margin being equal to the target trigger margin, the one or more program step characteristics can be adjusted by zero or a value close to zero, as described above, to maintain the determined trigger margin at the target trigger margin. In response to the determined trigger margin being greater than the target trigger margin, the one or more program step characteristics can be adjusted, as described above, to decrease the determined trigger margin.

At block 849, the processing device compares the adjusted TM to the target TM. At block 851, in response to the determined TM being different than the target TM, the processing device further adjusts one or more program step characteristics to adjust the adjusted TM to the target TM. As an example, the initial attempt of adjustment of the TM from the determined TM to the target TM may have some errors and this second comparison could identify those errors and adjust again. In the alternative, parameters while operating the memory could create anomalies in the memory cells and an adjustment to realign the TM to the target TM may be performed. These anomalies can be created by wearing on the memory cells from many reads and/or writes to and from the cells. These anomalies can be created by temperature fluctuations that may damage and/or alter the memory cells. Whiles these examples are given, examples are not so limited. Any parameters that affect the memory cells and their ability to be programmed and/or used to perform memory operations could affect the TM and use additional adjustment. This repetition of adjustment can be performed in a dynamic feedback loop where each subsequently adjusted TM is compared to a previously adjusted TM in order to fine tune the working TM to be the same as the target TM.

Figure 9:
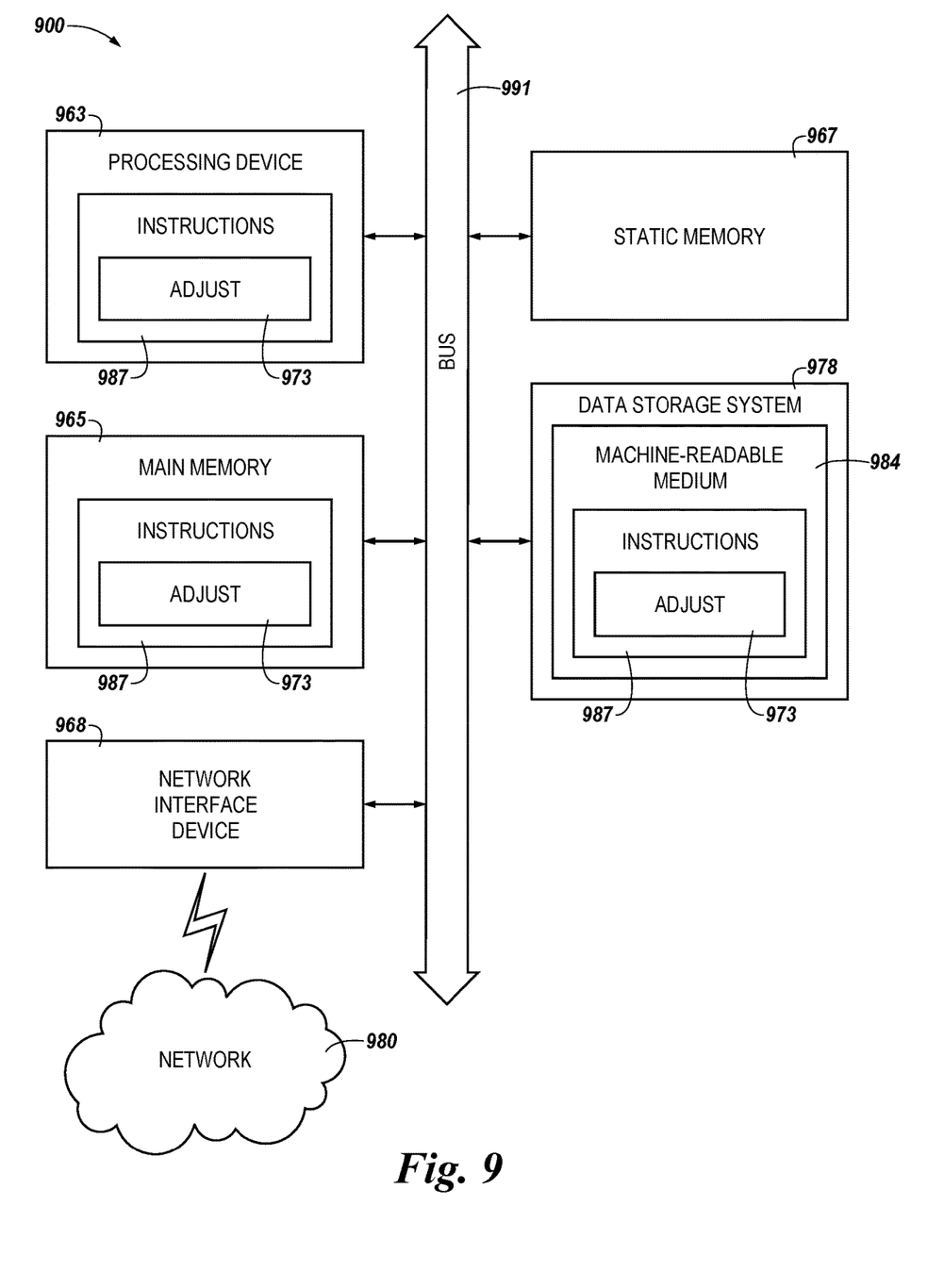
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as program step characteristic component 113. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 963, a main memory 965 (e.g., read-only memory (ROM), flash memory, dynamic random access memory (DRAM) such as synchronous DRAM (SDRAM) or Rambus DRAM (RDRAM), etc.), a static memory 967 (e.g., flash memory, static random access memory (SRAM), etc.), and a data storage system 979, which communicate with each other via a bus 991.

Processing device 963 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 963 can also be one or more special-purpose processing devices such as an application specific integrated circuit (ASIC), a field programmable gate array (FPGA), a digital signal processor (DSP), network processor, or the like. The processing device 963 is configured to execute instructions 987 for performing the adjustment operations using an adjustment component 973 (including either or both of the program step size component and the program step duration component previously described) and steps discussed herein. The computer system 900 can further include a network interface device 968 to communicate over the network 980.

The data storage system 978 can include a machine-readable storage medium 984 (also known as a computer-readable medium) on which is stored one or more sets of instructions 987 or software embodying any one or more of the methodologies or functions described herein. The instructions 987 can also reside, completely or at least partially, within the main memory 965 and/or within the processing device 963 during execution thereof by the computer system 900, the main memory 965 and the processing device 963 also constituting machine-readable storage media. The machine-readable storage medium 984, data storage system 978, and/or main memory 965 can correspond to the memory sub-system 104 of FIG. 1.

In one embodiment, the instructions 987 include instructions to implement functionality corresponding to a program step characteristic component (e.g., program step characteristic component 113 of FIG. 1). While the machine-readable storage medium 984 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory component including a plurality of memory cells; and
a processing device coupled to the memory component and configured to:
perform a scan of data associated with programmed memory cells, wherein the scan of data results in a bit error count (BEC) histogram;
determine a trigger margin based on the BEC histogram;
compare the determined trigger margin to a target trigger margin; and
in response to the determined trigger margin being different than the target trigger margin, adjust one or more program step characteristics to adjust the determined trigger margin toward the target trigger margin.

2. The system of claim 1, wherein the processing device is further configured to, prior to performing the scan of data, program at least a portion of a plurality of memory cells via a programming signal having the one or more program step characteristics.

3. The system of claim 1, wherein the one or more program step characteristics comprise a program step size and a program step duration.

4. The system of claim 3, wherein the processing device is further configured to adjust the program step size without adjusting the program step duration to adjust the determined trigger margin toward the target trigger margin.

5. The system of claim 1, wherein the processing device is further configured to adjust one of the program step characteristics without adjusting another program step characteristic to adjust the determined trigger margin toward the target trigger margin.

6. The system of claim 1, wherein the processing device is configured to:
adjust a first of the one or more program step characteristics a particular amount to adjust the determined trigger margin a first particular amount;
adjust a second of the one or more program step characteristics to adjust the determined trigger margin a second particular amount; and
in response to adjusting the determined trigger margin the first particular amount and the second particular amount, adjust the determined trigger margin to the target trigger margin.

7. The system of claim 1, wherein the processing device is further configured to determine that the determined trigger margin has changed from being at the target trigger margin to a non-target trigger margin.

8. The system of claim 7, wherein the processing device is further configured to, in response to determining that the determined trigger margin is at the non-target trigger margin, adjust one or more program step characteristics to adjust the non-target trigger margin toward the target trigger margin.

9. The system of claim 1, wherein:
the one or more program step characteristics comprises a program step size and a program step duration; and
the processing device is further configured to:
determine a step threshold for adjusting the program step size; and
determine a time threshold for adjusting the program step duration.

10. A method of operating a memory sub-system, wherein the method comprises:
programming at least a portion of a plurality of memory cells based on one or more program step characteristics;
performing a scan of data associated with the programmed memory cells, wherein the scan of data results in a bit error count (BEC) histogram of the programmed memory cells;
determining a trigger margin calculated from the BEC histogram;
compare the determined trigger margin to a target trigger margin; and
in response to the determined trigger margin being different than the target trigger margin, adjust the one or more program step characteristics to adjust the determined trigger margin to an adjusted trigger margin.

11. The method of claim 10, further comprising:
comparing the adjusted trigger margin to the target trigger margin; and
in response to the adjusted trigger margin being a same trigger margin as the target trigger margin, performing operations with the programmed memory cells using the adjusted one or more program step characteristics.

12. The method of claim 10, further comprising:
comparing the adjusted trigger margin to the target trigger margin; and
in response to the adjusted trigger margin being different than the target trigger margin, further adjusting the one or more program step characteristics to adjust the adjusted trigger margin to the target trigger margin.

13. The method of claim 10, wherein the memory component comprises a plurality of memory dies, and wherein the method further comprises:
programming each of the plurality of memory dies using the adjusted trigger margin that is a same trigger margin as the target trigger margin.

14. A system, comprising:
a memory component including a plurality of memory cells; and
a processing device coupled to the memory component and configured to:
compare a previously determined trigger margin associated with at least a portion of the plurality of memory cells to a target trigger margin; and
adjust one or more program step characteristics by respective determined amounts to adjust the previously determined trigger margin toward the target trigger margin.

15. The system of claim 14, wherein the one or more program step characteristics comprise one or more of a program step size and a program step duration.

16. The system of claim 15, wherein the determined amounts are based on a determined relationship between the program step size and the program step duration.

17. The system of claim 15, wherein the processing device is further configured to adjust the program step size and the program step duration in response to a change in programming of the memory component.

18. The system of claim 15, wherein the processing device is further configured to repeatedly adjust the program step size and the program step duration to maintain a constant trigger margin at a target trigger margin.

19. The system of claim 18, wherein the change in programming comprises a change due to wear cycling of the memory component.

20. The system of claim 18, wherein the change in programming comprises a temperature change in the memory component.

* * * * *